United States Patent
Sim et al.

(10) Patent No.: US 9,171,997 B2
(45) Date of Patent: Oct. 27, 2015

(54) SEMICONDUCTOR LIGHT EMITTING DEVICE

(71) Applicant: SAMSUNG ELECTRONICS CO., LTD., Suwon-Si (KR)

(72) Inventors: Eun Deok Sim, Yongin-si (KR); Sang Jo Kim, Gwangju (KR); Sung Tae Kim, Seoul (KR); Young Sun Kim, Gyeonggi-do (KR); Seong Ju Park, Gwangju (KR); Suk Ho Yoon, Seoul (KR); Sang Jun Lee, Gwangju (KR)

(73) Assignees: SAMSUNG ELECTRONICS CO., LTD., Suwon-Si, Gyeonggi-Do (KR); GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 0 days.

(21) Appl. No.: 14/255,854

(22) Filed: Apr. 17, 2014

(65) Prior Publication Data
US 2014/0346437 A1 Nov. 27, 2014

(30) Foreign Application Priority Data
May 27, 2013 (KR) ........................ 10-2013-0059941

(51) Int. Cl.
*H01L 31/0328* (2006.01)
*H01L 27/15* (2006.01)
(Continued)

(52) U.S. Cl.
CPC ............ *H01L 33/06* (2013.01); *H01L 33/0025* (2013.01); *H01L 33/32* (2013.01); *H01L 33/382* (2013.01)

(58) Field of Classification Search
CPC ........ B82Y 20/00; B82Y 10/00; H01L 33/06; H01L 33/0075; H01L 33/0079; H01L 33/32; H01L 33/54; H01L 33/62; H01L 27/15; H01L 21/8252; H01L 2924/01079; H01J 1/34; H01J 2201/3423
USPC .......... 438/22–27, 29, 37, 45–47; 257/11–14, 257/79, 80, 85
See application file for complete search history.

(56) References Cited

U.S. PATENT DOCUMENTS

| | | | |
|---|---|---|---|
| 6,372,608 B1 | 4/2002 | Shimoda et al. | |
| 6,645,830 B2 | 11/2003 | Shimoda et al. | |

(Continued)

FOREIGN PATENT DOCUMENTS

| | | |
|---|---|---|
| JP | 2009-004555 A | 1/2009 |
| JP | 2009-182347 A | 8/2009 |

(Continued)

*Primary Examiner* — Hsien Ming Lee
(74) *Attorney, Agent, or Firm* — McDermott Will & Emery LLP

(57) ABSTRACT

A semiconductor light emitting device is provided including a first conductivity-type semiconductor layer, an active layer including at least one quantum barrier layer made of $In_xGa_{(1-x)}N$, wherein $0 \leq x < y$, and at least one quantum well layer made of $In_yGa_{(1-y)}N$, wherein $0 < y \leq 1$, disposed therein, and a second conductivity-type semiconductor layer, wherein the quantum barrier layer includes first and second graded layers disposed in order toward the first conductivity-type semiconductor layer. The first graded layer contains indium whose content increases in a direction towards the second conductivity-type semiconductor layer, and the second graded layer contains indium whose content decreased in a direction toward the second conductivity-type semiconductor layer.

18 Claims, 16 Drawing Sheets

(51) Int. Cl.
*H01L 21/00* (2006.01)
*H01L 33/06* (2010.01)
*H01L 33/32* (2010.01)
*H01L 33/00* (2010.01)
*H01L 33/38* (2010.01)

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,615,772 B2 | 11/2009 | Lee | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,106,421 B2 * | 1/2012 | Ahn | 257/184 |
| 8,129,711 B2 | 3/2012 | Kang et al. | |
| 8,179,938 B2 | 5/2012 | Kim | |
| 8,193,545 B2 | 6/2012 | Lee | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,575,593 B2 * | 11/2013 | Han et al. | 257/14 |
| 8,779,412 B2 * | 7/2014 | Han et al. | 257/14 |
| 2007/0278474 A1 | 12/2007 | Tsutsumi et al. | |
| 2008/0023690 A1 | 1/2008 | Moon | |
| 2008/0237570 A1 | 10/2008 | Choi et al. | |
| 2010/0059735 A1 | 3/2010 | Lee et al. | |
| 2011/0140079 A1 | 6/2011 | Jang et al. | |

FOREIGN PATENT DOCUMENTS

| | | |
|---|---|---|
| KR | 10-0608928 B1 | 8/2006 |
| KR | 10-0781772 B1 | 12/2007 |
| KR | 10-2008-0061698 A | 7/2008 |
| KR | 10-2010-0020165 A | 2/2010 |
| KR | 10-1198759 B1 | 11/2012 |

* cited by examiner

SEMICONDUCTOR LIGHT EMITTING DEVICE

CROSS-REFERENCE TO RELATED APPLICATIONS

This application claims the priority of Korean Patent Application No. 10-2013-0059941 filed on May 27, 2013, in the Korean Intellectual Property Office, the disclosure of which is incorporated herein by reference.

TECHNICAL FIELD

The present disclosure relates to a semiconductor light emitting device.

BACKGROUND

A light emitting diode (LED), a type of semiconductor light emitting device, is a semiconductor device capable of generating light of various colors according to the recombination of electrons and holes. Compared with a filament-based light emitting device, the semiconductor light emitting device has various advantages such as a long lifespan, low power consumption, excellent initial driving characteristics, high vibration resistance, and the like, and thus, demand for the semiconductor light emitting device continues to grow. In particular, recently, a Group III-nitride semiconductor capable of emitting short-wavelength blue light has come to prominence. However, nitride semiconductors experience efficiency droop, in which quantum efficiency is degraded as injection current density is increased. Thus, in the art, a method for enhancing quantum efficiency of a semiconductor light emitting device is required.

SUMMARY

An aspect of the present disclosure provides a semiconductor light emitting device in which polarization in an active layer is minimized to enhance quantum efficiency.

However, objects of the present disclosure are not limited thereto and objects and effects that may be recognized from technical solutions or embodiments described hereinafter may also be included although not explicitly mentioned.

According to an aspect of the present disclosure, there is provided a semiconductor light emitting device including a first conductivity-type semiconductor layer, an active layer disposed on the first conductivity-type semiconductor layer and including at least one quantum barrier layer made of $In_xGa_{(1-x)}N$, wherein $0 \leq x < y$, and at least one quantum well layer made of $In_yGa_{(1-y)}N$, wherein $0 < y \leq 1$, alternately disposed therein, and a second conductivity-type semiconductor layer disposed on the active layer. The quantum barrier layer includes first and second graded layers, and the first graded layer is disposed between the first conductivity-type semiconductor layer and the second graded layer. The first graded layer contains indium (In) whose content increases in a direction toward the second conductivity-type semiconductor layer, and the second graded layer contains indium (In) whose content decreases in a direction toward the second conductivity-type semiconductor layer.

The quantum barrier layer may include a first external barrier layer disposed between the first conductivity-type semiconductor layer and the first graded layer, and a second external barrier layer disposed in between the second conductivity-type semiconductor layer and the second graded layer.

The first and second external barrier layers may be made of GaN.

The first and second external barrier layers may be formed to be thicker than the first and second graded layers.

The first graded layer may be made of $In_{x1}Ga_{(1-x1)}N$ in which the value x1 gradually increases from 0 to z, and the second grade layer may be made of $In_{x2}Ga_{(1-x2)}N$ in which the value x2 gradually decreases from z to 0, wherein $0 < z < y$ is satisfied. The value z may range from about 0.01 to about 0.08. The quantum barrier layer may further include an internal barrier layer disposed between the first and second graded layers and made of $In_zGa_{(1-z)}N$.

An energy band of the quantum barrier layer may have a symmetrical shape about the center of the internal barrier layer.

The first and second graded layers may be formed to be contiguous, and an energy band of the quantum barrier layer may have a symmetrical shape about an interface in which the first and second graded layers are contiguous.

Thicknesses of the first and second graded layers may range from about 3 Å to about 50 Å.

The first graded layer may include a first region in which the content of indium (In) increases with a first slope and a second region in which the content of indium (In) increases with a second slope. In certain embodiments, the absolute values of the first and second slopes are different.

The second graded layer may include a third region in which the content of indium (In) decreases with a third slope and a fourth region in which the content of indium (In) decreases with a fourth slope. In certain embodiments, the absolute values of the third and fourth slopes are different).

According to another aspect of the present disclosure, there is provided a semiconductor light emitting device including a first conductivity-type semiconductor layer, a second conductivity-type semiconductor layer, and an active layer disposed between the first and second conductivity-type semiconductor layers and including at least one quantum barrier layer and at least one quantum well layer made of $In_yGa_{(1-y)}N$, wherein $0 < y < 1$, alternatively disposed therein. The quantum barrier layer includes an internal barrier layer made of $In_zGa_{(1-z)}N$, wherein $0 < z < y$, external barrier layers formed on both sides of the internal barrier layer and made of GaN, and graded layers disposed between the internal barrier layer and each of external barrier layers and made of $In_xGa_{(1-x)}N$, wherein $0 \leq x \leq z$, in which the content of indium (In) increases toward the internal barrier layer.

The value x of the graded layers made of $In_xGa_{(1-x)}N$ ($0 \leq x \leq z$) may gradually increase from 0 to z in the graded layers closer to the internal barrier layer. The value z is determined within a range from about 0.01 to about 0.08.

The graded layers disposed between the internal barrier layer and each of the external barrier layers may have a thickness ranging from about 3 Å to about 50 Å.

According to another aspect of the present disclosure, a semiconductor light emitting device is provided comprising a first conductivity-type semiconductor layer and a second conductivity-type semiconductor layer. An active layer is disposed between the first and second conductivity-type semiconductor layers and includes at least one quantum barrier layer and at least one quantum well layer made of $In_yGa_{(1-y)}N$, wherein $0 < y < 1$, alternatively disposed therein. The quantum barrier layer comprises an internal barrier layer with two opposing major sides made of $In_zGa_{(1-z)}N$, wherein $0 < z < y$. A first external barrier layer made of GaN is arranged on one major side of the internal barrier layer, and a second external barrier layer made of GaN arranged on a second opposing major side of the internal barrier. A first graded layer is disposed between the internal barrier layer and the first external barrier layer, and a second graded layer is disposed between the internal barrier layer and the second external barrier layer. The first and second graded layers are made of $In_xGa_{(1-x)}N$, wherein $0 \leq x \leq z$, in which the content of In increases toward the internal barrier layer. The first graded layer comprises a first region in which a content of In increases with a first slope and a second region in which a content of In increases with a second slope, wherein absolute values of the first and second slopes are different. The second graded layer comprises a third region in which a content of In decreases with a third slope and a fourth region in which a content of In decreases with a fourth slope, wherein absolute values of the third and fourth slopes are different.

In certain embodiments, the first region is located closer to the first external barrier layer than the second region, the fourth region is located closer to the second external barrier layer than the third region, the first slope is steeper than the second slope, and the fourth slope is steeper than the third slope.

In certain embodiments, the first region is located closer to the first external barrier layer than the second region, the fourth region is located closer to the second external barrier layer than the third region, the first slope is shallower than the second slope, and the fourth slope is shallower than the third slope.

The first and fourth slopes may have substantially a same absolute value, and the second and third slopes may have substantially a same absolute values.

The first and second graded layers disposed between the internal barrier layer and each of the external barrier layers may have a thickness ranging from about 3 Å to about 50 Å, respectively.

The foregoing technical solutions do not fully enumerate all of the features of the present disclosure. The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

The above and other aspects, features and other advantages of the present disclosure will be more clearly understood from the following detailed description taken in conjunction with the accompanying drawings.

DETAILED DESCRIPTION

Figure 1:
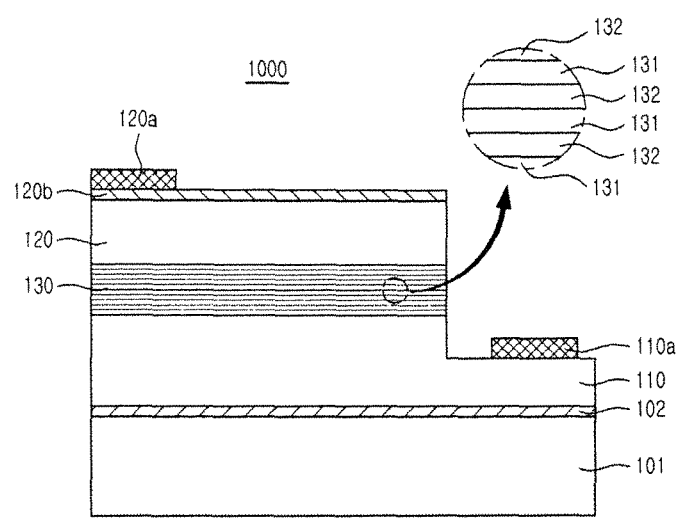
FIG. 1 is a cross-sectional view schematically illustrating a semiconductor light emitting device according to an embodiment of the present disclosure.

Hereinafter, embodiments of the present disclosure will be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like components.

FIG. 1 is a cross-sectional view schematically illustrating a semiconductor light emitting device according to an embodiment of the present disclosure.

Referring to FIG. 1, a semiconductor light emitting device 1000 according to the present embodiment includes a substrate 101, a first conductivity-type semiconductor layer 110 formed on the substrate 101, an active layer 130 formed on the first conductivity-type semiconductor layer 110 and including a quantum well layer 131 and a quantum barrier layer 132, a second conductivity-type semiconductor layer 120 formed on the active layer 130, and first and second electrodes 110a and 120a electrically connected to the first and second conductivity-type semiconductor layers 110 and 120.

The substrate 101 is a semiconductor growth substrate. As the substrate 101, a substrate made of an insulating, conductive, or semiconductive material such as sapphire, Si, SiC, $MgAl_2O_4$, MgO, $LiAlO_2$, $LiGaO_2$, GaN, or the like, may be used. In this case, sapphire having electrical insulation characteristics may be used. Sapphire is a crystal having Hexa-Rhombo R3c symmetry, of which lattice constants in c-axis and a-axis directions are 13.001 Å and 4.758 Å, respectively. A sapphire crystal has a C (0001) plane, an A (1120) plane, an R (1102) plane, and the like. In this case, a nitride thin film can be relatively easily formed on the C plane of the sapphire crystal, and because sapphire crystal is stable at high temperatures, it is commonly used as a material for a nitride growth substrate.

Also, a silicon (Si) substrate may be appropriately used as the substrate 101. Mass-production may be facilitated by using the silicon (Si) substrate which may have a large diameter and be relatively cheap. When the silicon (Si) substrate is used, a nucleation layer made of a material such as $Al_xGa_{1-x}N$, wherein $0 \le x \le 1$, may be formed on the substrate 101 and a nitride semiconductor having a desired structure may be grown on the nucleation layer.

Meanwhile, after a light emitting structure including the first and second conductivity-type semiconductor layers 110 and 120 and the active layer 130 disposed therebetween is grown, the substrate 101 may be removed. For example, a sapphire substrate may be removed by using a laser lift-off (LLO) process of irradiating a laser to the interface between the sapphire substrate and the light emitting structure, or the like, and a silicon (Si) substrate or a silicon carbide (SiC) substrate 101 may be removed through a method such as polishing, etching, or the like.

In the present embodiment, a buffer layer 102 may be interposed between the substrate 101 and the first conductivity-type semiconductor layer 110. In general, when a light emitting structure is grown on the substrate 101, such as when GaN thin film is grown as a light emitting structure on the heterogeneous substrate 101, a lattice constant mismatch between the substrate 101 and the GaN thin may cause a lattice defect such as dislocations, and a difference in coefficients of thermal expansion therebetween may cause the substrate 101 to warped thereby result in the generation of cracks in the light emitting structure. In order to control such defects and warpage, the buffer layer 102 may be formed on the substrate 101 and a light emitting structure having a desired structure, e.g., the first conductivity-type semiconductor layer 110 made of a nitride semiconductor, may be grown on the buffer layer 102. The buffer layer 102 may be a low temperature buffer layer formed at a temperature lower than a growth temperature of a single crystal constituting the light emitting structure, but the present inventive concept is not limited thereto.

As a material for forming the buffer layer 102, $Al_xIn_yGa_{1-x-y}N$, wherein $0 \le x \le 1$ and $0 \le y \le 1$, in particular, GaN, AlN, or AlGaN, may be used. For example, the buffer layer 102 may be an undoped GaN layer, without impurities, having a predetermined thickness.

Of course, the present disclosure is not limited thereto and any structure may be employed as long as it can enhance crystallinity of the light emitting structure, and a material such as $ZrB_2$, $HfB_2$, ZrN, HfN, TiN, ZnO, or the like, may also be used. Also, the buffer layer 102 may be formed by combining a plurality of layers or may be formed as a layer in which compositions thereof are gradually changed.

The first and second conductivity-type semiconductor layers 110 and 120 may be configured as semiconductor layers doped with n-type and p-type impurities, respectively. However, the present disclosure is not limited thereto and, conversely, the first and second conductivity-type semiconductor layers 110 and 120 may be p-type and n-type semiconductor layers, respectively. Also, the first and second conductivity-type semiconductor layers 110 and 120 may be made of a nitride semiconductor, e.g., a material having a composition of $Al_xIn_yGa_{1-x-y}N$, wherein $0 \le x \le 1$, $0 \le y \le 1$, and $0 \le x+y \le 1$. Besides, the first and second conductivity-type semiconductor layers 110 and 120 may also be made of a material such as an AlGaInP-based semiconductor or an AlGaAs-based semiconductor.

The active layer 130 formed between the first and second conductivity-type semiconductor layers 110 and 120 emits light having a predetermined level of energy according to the recombination of electrons and holes and may have a multi-quantum well (MQW) structure in which a quantum well layer 131 and a quantum barrier layer 132 are alternately laminated at least once. For example, in the case of a nitride semiconductor, the quantum well layer 131 may be made of $In_yGa_{(1-y)}N$, wherein $0 < y \le 1$, and the quantum barrier layer 132 may have a region made of GaN, which may contain indium (In), wherein the content of indium (In) may be less than that of the quantum well layer 131.

In the present embodiment, the quantum well layer 131 and the quantum barrier layer 132 have an energy band structure and composition such that an influence of piezoelectric polarization is alleviated and the efficiency of electron-hole recombination is increased. Accordingly, a so-called efficiency droop phenomenon, wherein luminance efficiency is reduced when a high current is applied can be improved. Details thereof will be described supra.

Meanwhile, the first and second conductivity-type semiconductor layers 110 and 120 and the active layer 130 may be formed by using a semiconductor growth process such as metal organic chemical vapor deposition (MOCVD), hydride vapor phase epitaxy (HVPE), molecular beam epitaxy (MBE), or the like.

The first and second electrodes 110a and 120a are provided as means electrically connected to the first and second conductivity-type semiconductor layers 110 and 120 to apply driving power to the light emitting device. The first and second electrodes 110a and 120a may be made of a known electrically conductive material selected from among silver (Ag), aluminum (Al), nickel (Ni), chromium (Cr), palladium (Pd), copper (Cu), platinum (Pt), tin (Sn), tungsten (W), gold (Au), rhodium (Rh), iridium (Ir), ruthenium (Ru), magnesium (Mg), zinc (Zn), and the like, and may be formed through a process such as deposition, sputtering, plating, or the like, respectively. Also, the first and second electrodes 110a and 120a may have a structure including two or more layers such as Ni/Ag, Zn/Ag, Ni/Al, Zn/Al, Pd/Ag, Pd/Al, Ir/Ag. Ir/Au, Pt/Ag, Pt/Al, Ni/Ag/Pt, or the like. However, the present inventive concept is not limited thereto and any material may be used to form the first and second electrodes 110a and 120a as long as it has conductivity.

Meanwhile, an ohmic-electrode layer 120b may be formed between the second conductivity-type semiconductor layer 120 and the second electrode 120a. The ohmic-electrode layer 120b may be made of a material exhibiting electrical ohmic-characteristics with respect to the second conductivity-type semiconductor layer 120. In case of a light emitting device having a structure in which light generated by the active layer 130 is output externally by way of the second conductivity-type semiconductor layer 120, the ohmic-electrode layer 120b may be made of a transparent conductive oxide such as ITO, CIO, ZnO, or the like, having relatively good ohmic-contact performance, while having a high degree of light transmittance, among materials for a transparent electrode, but the present disclosure is not limited thereto.

Also, when a light emitting device having a structure in which light generated by the active layer 130 is output externally by way of the first conductivity-type semiconductor layer 110, such as a so-called flipchip type light emitting device, in which the first and second electrodes 110a and 120a are mounted to face a lead frame, or the like, of a package, the ohmic-electrode layer 120b may be made of a light reflective material, such as, a highly reflective metal. However, the ohmic-electrode layer 120b is not an essential element in the present embodiment and may be excluded according to circumstances.

Also, in the case of the structure illustrated in FIG. 1, the first and second electrodes 110a and 120a are disposed on the first conductivity-type semiconductor layer 110 and the ohmic-electrode layer 120b, respectively, but such an electrode formation scheme is merely an example and the first and second electrodes 110a and 120a may be formed in various positions of the light emitting structure including the first and second conductivity-type semiconductor layers 110 and 120 and the active layer 130.

Figure 2:
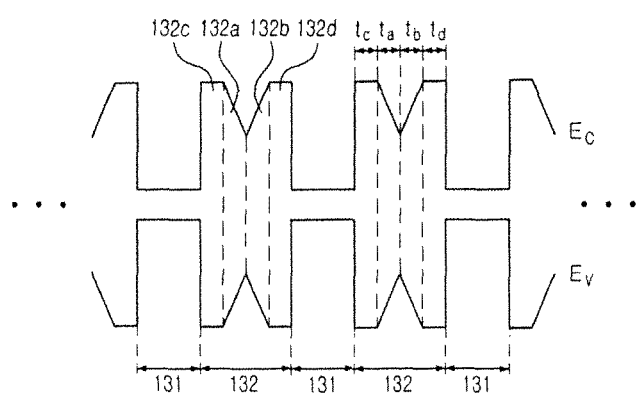
FIG. 2 is an energy band diagram of an active layer employable in the semiconductor light emitting device of FIG. 1.

FIG. 2 is an energy band diagram of the active layer 130 according to an embodiment of the present disclosure. The active layer 130 will be described in detail with reference to FIG. 2.

Referring to FIGS. 1 and 2, the active layer 130 according to an embodiment of the present disclosure includes a plurality of quantum well layers 131 made of $In_yGa_{(1-y)}N$, wherein $0<y\leq1$, and a plurality of quantum barrier layers 132 made of $In_xGa_{(1-x)}N$, wherein $0\leq x<y$, disposed alternately. Here, each quantum barrier layer 132 may include first and second graded layers 132a and 132b, and the first graded layer 132a is disposed between the first conductivity-type semiconductor layer 110 and the second graded layer 132b.

In the present embodiment, the first graded layer 132a may contain indium (In) whose content is increased toward the second conductivity-type semiconductor layer 120 (e.g., in a direction in which the second conductivity-type semiconductor layer 120 is disposed). In detail, the first graded layer 132a may be made of $In_{x1}Ga_{(1-x1)}N$ in which the value x1 is gradually increased from 0 to z, and accordingly, as illustrated in FIG. 2, an energy band of the first graded layer 132a (described based on a conduction band) is decreased toward the right side (e.g., toward the second conductivity-type semiconductor layer or in the direction in which the second conductivity-type semiconductor layer is disposed). Here, the direction in which the second conductivity-type semiconductor layer is disposed corresponds to an upward direction on the basis of FIG. 1 and corresponds to a rightward direction on the basis of FIG. 2.

Also, the second graded layer 132b may contain indium (In) whose content is reduced toward the second conductivity-type semiconductor layer 120. For example, the second graded layer 132b may be made of $In_{x2}Ga_{(1-x2)}N$ in which the value x2 gradually decreases from z to 0, and accordingly, an energy band of the second graded layer 132b is increased toward the right side.

Meanwhile, since the first and second graded layers 132a and 132b are included in the quantum barrier layer 132, in order to differentiate from the quantum well layer 131, an energy band gap of the first and second graded layers 132a and 132b is required to be greater than that of the quantum well layer 131. Thus, the value z is required to be set to be greater than 0 but smaller than y as the content of indium (In) of the quantum well layer 131 (e.g., $0<z<y$). For example, the value z may range from 0.01 to 0.08.

In the present embodiment, the value x as the content of indium (In) of the first and second graded layers 132a and 132b is illustrated such that an absolute value thereof increases and decreases from 0 to z with the same slope. However, the present disclosure is not limited thereto and the content of indium (In) of the first graded layer 132a and that of the second graded layer 132b may increase and decrease with slopes of different absolute values. This may be achieved by setting the thicknesses of the first and second graded layers 132a and 132b differently on the basis that the first and second graded layers 132a and 132b are in contact.

Further, as illustrated, the first and second graded layers 132a and 132b may be in contact, and accordingly, a region in which an energy band is a downwardly pointed, a sharp shape may be formed between the first and second graded layers 132a and 132b based on the basis of a conduction band. Also, when the first and second graded layers 132a and 132b are in contact, an energy band of the quantum barrier layer 132 may have a symmetrical shape on the basis of the interface in which the first and second graded layers 132a and 132b are contiguous. However, the energy band shape may be changed according to process conditions or as necessary. According to an embodiment, the energy band may have an asymmetrical shape.

Meanwhile, in the present embodiment, as mentioned above, the quantum barrier layer 132 may be made of $In_xGa_{(1-x)}N$, wherein $0\leq x<y$, and may include regions in which the value x is 0. In other words, the quantum barrier layer 132 may include regions made of GaN. The regions corresponds to a region formed in the left (a position adjacent to the first conductivity-type semiconductor layer 110) of the first graded layer 132a and a region formed in the right (a position adjacent to the second-conductivity type semiconductor layer 120) of the second graded layer 132b. Hereinafter, the regions will be defined as a first external barrier layer 132c and a second external barrier layer 132d.

The first and second external barrier layers 132c and 132d are made of a GaN material not containing indium (In), having a larger energy band gap, and effectively confining electrons to the quantum well layer 131. In the present embodiment, the first and second external barrier layers 132c and 132d may be thicker than the first and second graded layers 132a and 132b in order to confine electrons to the quantum well layer 131 and prevent an overflow phenomenon of electrons (namely, $t_c>t_a$, $t_c>t_b$, $t_d>t_a$, $t_d>t_b$).

In the present embodiment, the quantum barrier layer 132 is made of $In_xGa_{(1-x)}N$, wherein $0\leq x<y$, and includes the first graded layer 132a having an increased content of indium (In) and the second graded layer 132b having decreased content of indium (In), thereby effectively reducing an internal electrical field due to piezoelectric polarization within the active layer 130. This will be described in detail with reference to FIGS. 3 and 4.

Figure 3:
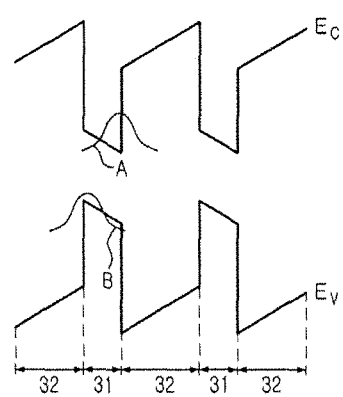
FIG. 3 is an energy band diagram of an active layer of a related art together with a wave function of a carrier.

FIG. 3 illustrates an energy band diagram in a conventional active layer having a multi-quantum well (MQW) structure in which a plurality of laminated quantum well layers 31 made of $In_yGa_{(1-y)}N$ ($0<y\leq1$) and a plurality of quantum wells made of GaN are laminated, together with a wave function of a carrier.

In case of a nitride semiconductor, an internal electrical field may be generated by a piezoelectric polarization due to strain resulting from spontaneous polarization and lattice constant mismatch between Ga atoms and N atoms. In particular, in this case, piezoelectric polarization due to strain resulting from lattice constant mismatch between the quantum well layer 31 made of $In_yGa_{(1-y)}N$ and the quantum barrier layer 32 made of GaN may significantly affect, and the generated internal electrical field may cause distortion in an energy band of the active layer as illustrated in FIG. 3.

In detail, as illustrated in FIG. 3, the apex of a wave function A indicating a distribution of electrons appears to be slanted toward the p-type nitride semiconductor layer (rightwardly) from the center, and a wave function B of holes appears to be slanted toward the n-type nitride semiconductor layer (leftwardly). Thus, since the wave function A of electrons and the wave function B of holes are positioned in the mutually opposite sides within the quantum well layer 131, electron-hole recombination efficiency for light emission is reduced due to the characteristics that electron-hole recombination efficiency is proportional to an overlap area in which two wave functions overlap. In particular, the reduction in luminous efficiency due to an internal electrical field caused by piezoelectric polarization is a main reason for efficiency droop phenomenon of a semiconductor light emitting device.

Meanwhile, in the present embodiment, since the first and second graded layers 132a and 132b having the gradually changing content of indium (In) are interposed between the first and second external barrier layers 132c and 132d made of GaN, a lattice contact mismatch generated between the quantum well layer 131 and the quantum barrier layer 32 within the active layer 130 can be resolved, and since strain is alleviated, piezoelectrical polarization can be reduced.

To this end, the first and second graded layers 132a and 132b may have sufficient thicknesses ($t_a$, $t_b$). According to an embodiment, the first and second graded layers 132a and 132b may have a thickness ranging from 3 Å to 50 Å, respectively. Namely, in case of a quantum barrier layer 132 formed to have a thickness equal to 200 Å, for example, the sum ($t_a+t_b$) of the thicknesses of the first and second graded layers 132a and 132b may amount to a thickness ratio ranging from 3% to 50% within the quantum barrier layer 132.

Also, since the first graded layer 132a is formed such that the content of indium (In) therein gradually increases and the second graded layer 132b is formed so that the content of indium (In) therein gradually decreases, forming an energy band having a sharp downward shape, an efficiency droop phenomenon in a high current region can be effectively improved. A detailed comparison will be described with reference to FIG. 4.

Figure 4:
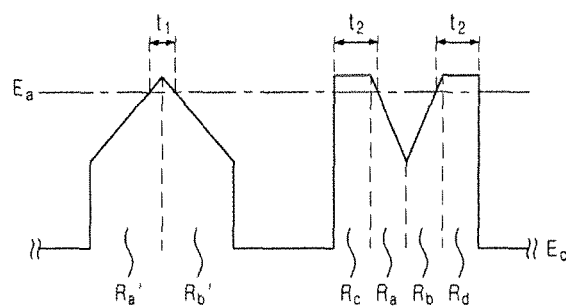
FIG. 4 is an energy band diagram illustrating a feature of the semiconductor light emitting device according to an embodiment of the present disclosure.

FIG. 4 illustrates a comparison between effects of energy bands according to the present embodiment and a comparative example, in which only a conduction band of an energy band diagram is illustrated. An energy band according to the comparative example is illustrated on the left and an energy band according to the present embodiment is illustrated on the right.

According to the comparative example illustrated on the left of FIG. 4, the quantum barrier layer is made of $In_xGa_{(1-x)}N$ and includes a region Ra' in which the value x as the content of indium (In) gradually decreases from a pre-set value to 0 and a region Rb' in which the value x gradually increases from 0 to a pre-set value. Meanwhile, an example of the present embodiment illustrated on the right of FIG. 4, the quantum barrier layer 132 is made of $In_xGa_{(1-x)}N$ and include a first graded layer region Ra in which the value x gradually increases from 0 to a pre-set value and a second graded layer region Rb in which the value x decreases from a pre-set value to 0.

Here, a probability that electrons having a high energy level Ea tunnel the quantum barrier layer decreases as a thickness of the quantum barrier layer increases. In the case of the present embodiment, since the thickness of the quantum barrier layer at the high energy level Ea is great (t2 over t1), relative to the comparative example, tunneling conduction of electrons having a high energy level can be effectively prevented and an efficiency droop phenomenon can be improved.

FIGS. 5 through 7B are energy band diagrams illustrating a modification of the active layer 130 employable in the semiconductor light emitting device.

Figure 5:
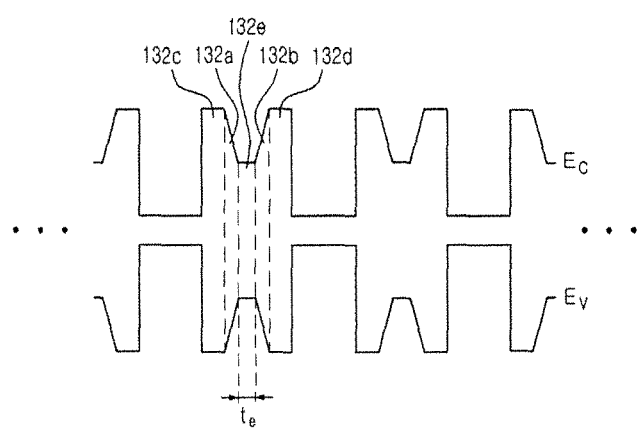
FIGS. 5 through 7B are energy band diagrams illustrating a modification of an active layer employable in an embodiment of the present disclosure.

Referring to FIG. 5, in the active layer 130 according to the present embodiment, a plurality of quantum barrier layers made of $In_xGa_{(1-x)}N$, wherein 0≤x<y, and a plurality of quantum well layers made of $In_yGa_{(1-y)}N$, wherein 0<y≤1, are alternately disposed, and the quantum barrier layer includes first and second external barrier layers 132c and 132d and first and second graded layers 132a and 132b. Here, as mentioned above in the former embodiment, the content of indium (In) of the first and second graded layers 132a and 132b may be changed as the value x is gradually increased or decreased from 0 to z, respectively. Meanwhile, since the first and second graded layers 132a and 132b are included within the quantum barrier layer 132, an energy band gap thereof is required to be formed to be greater than that of the quantum well layer so as differentiate from the quantum well layer. Thus, the value z is required to satisfy 0<z<y.

In the present embodiment, the quantum barrier layer further includes an internal barrier layer 132e formed between the first and second graded layers 132a and 132b and made of $In_zGa_{(1-z)}N$.

According to the present embodiment, the quantum barrier layer may be understood as including the internal barrier layer 132e made of $In_zGa_{(1-z)}N$ (0<z<y), the external barrier layers 132c and 132d formed at both sides of the internal barrier layer 132e and made of GaN; and the graded layers 132a and 132b formed between the internal barrier layer 132e and the external barrier layers 132c and 132d, respectively, wherein the graded layers are made of $In_xGa_{(1-x)}N$, wherein 0≤x≤z, such that the content of indium (In) increases toward the internal barrier layer 132e.

Also, an energy band of the quantum barrier layer may be symmetrical on the basis of the center of the internal barrier layer 132e. However, the energy band may be changed according to a process condition or as necessary. According to an embodiment, the quantum barrier layer may be formed to have an energy band having an asymmetrical shape.

According to the present embodiment, since the internal barrier layer 132e in which a uniform content of indium (In) is maintained is included within the quantum barrier layer, strain between the quantum barrier layer and the quantum well layer is reduced, and since the content of indium (In) within the quantum barrier layer is uniformly maintained within a predetermined thickness range, a degradation of crystal quality of the quantum barrier layer can be alleviated by a predetermined level. To this end, the internal barrier layer 132e may have a predetermined thickness, and in this case, in consideration of an electron confinement effect of the quantum barrier layer, the thickness ($t_e$) of the internal barrier layer 132e may be appropriately selected within a thickness range of less than 50 Å.

FIGS. 6 and 7 are energy band diagrams illustrating another modification of the active layer 130 employable in an embodiment of the present disclosure. Here, for clarification and simplicity, only a conduction band of energy band diagrams is illustrated.

Figure 6A:
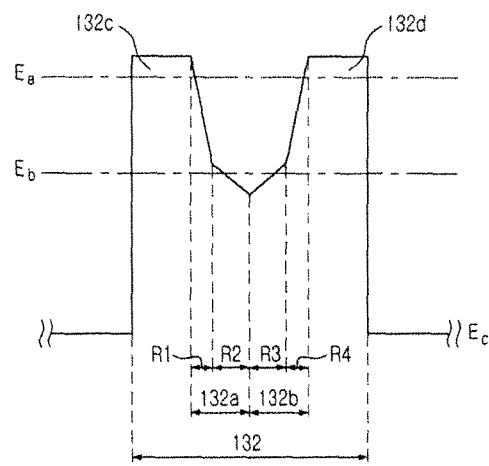
Figure 7A:
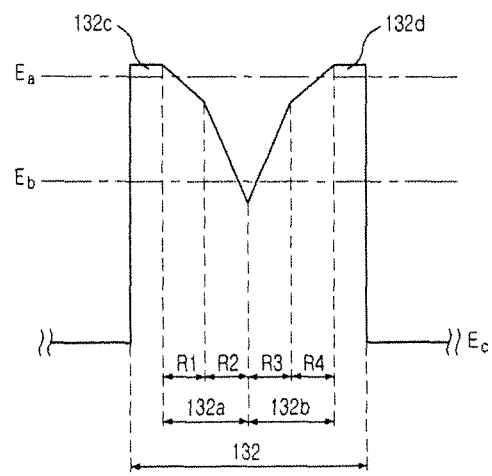

First, referring to FIGS. 6A and 7A, the first graded layer 132a according to the present embodiment may include a first region R1 in which the content of indium (In) increases with a first slope and a second region R2 in which the content of indium (In) increases with a second slope. Here, the first slope and the second slope have different absolute values. Also, the second graded layer 132b may include a third region R3 in which the content of indium (In) decreases with a third slope and a fourth region in which the content of indium (In) decreases with a fourth slope.

The first slope of the first graded layer 132a and the fourth slope of the second graded layer 132b may have the same absolute value, but the present disclosure is not limited thereto and the first slope of the first graded layer 132a and the fourth slope of the second graded layer 132b may have different slopes. This is applied in the same manner to the second slope of the first graded layer 132a and the third slope of the second graded layer 132b. In this manner, the first and second graded layers 132a and 132b may contain indium (In) whose content increases or decreases with two or more different slopes, respectively.

The embodiment of FIG. 6A will be described in more detail. The first graded layer 132a includes the first region R1 in which the content of indium (In) increases with the first slope and the second region R2 in which the content of indium (In) increases with the second slope. The second graded layer 132b includes the third region R3 in which the content of indium (In) decreases with the third slope and the fourth region R4 in which the content of indium (In) decreases with the fourth slope. In this case, a thickness of the barrier layer with respect to electrons having a high energy level Ea is relatively large, thus effectively preventing tunneling conduction of electrons having a high energy level and increasing an electron confinement effect.

Meanwhile, in the case of the embodiment of FIG. 7A, the first graded layer 132a includes the first region R1 in which the content of indium (In) increases with the first slope and the second region R2 in which the content of indium (In) increases with the second slope having an absolute value greater than that of the first slope. The second graded layer 132b includes the third region R3 in which the content of indium (In) decreases with the third slope and the fourth region R4 in which the content of indium (In) decreases with the fourth slope having an absolute value smaller than that of the third slope. In this case, a thickness of the barrier layer with respect to electrons having a relatively low energy level Eb, relative to the case of FIG. 6A, is large, thereby more effectively confining electrons having a low energy level Eb and guaranteeing mobility of electrons having a higher energy level Ea.

The energy band shape of FIGS. 6A and 7A may be appropriately selected according to a process condition or as necessary.

Figure 6B:
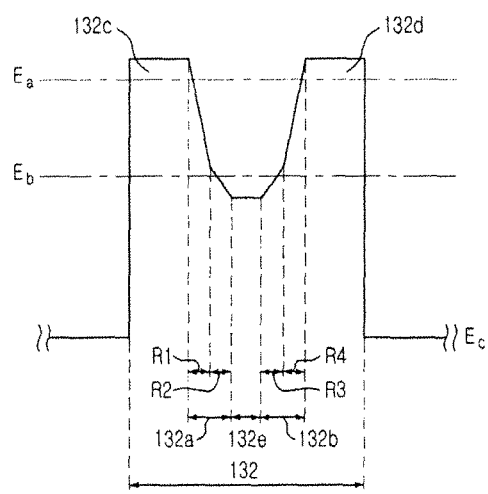
Figure 7B:
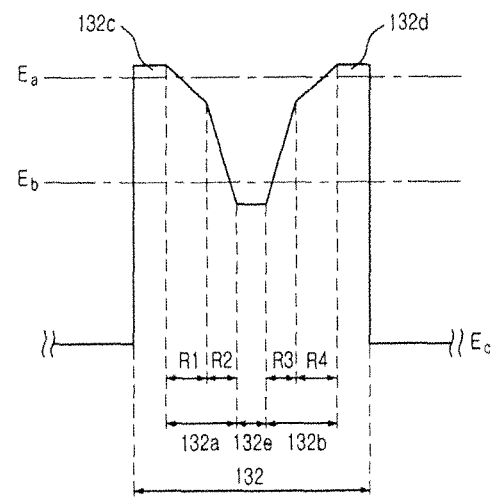

In FIGS. 6B and 7B, unlike the embodiments of FIGS. 6A and 7A, the internal barrier layer 132e disposed between the first and second graded layers 132a and 132b is further provided. In this case, the internal barrier layer 132e in which the content of indium (In) is uniformly maintained is included within the quantum barrier layer 132 to effectively reduce strain between the quantum barrier layer 132 and the quantum well layer 131, and since the content of indium (In) within the quantum barrier layer 132 is uniformly maintained within a predetermined thickness range, a degradation of crystal quality of the quantum barrier layer 132 may be prevented by a predetermined level.

Figure 8A:
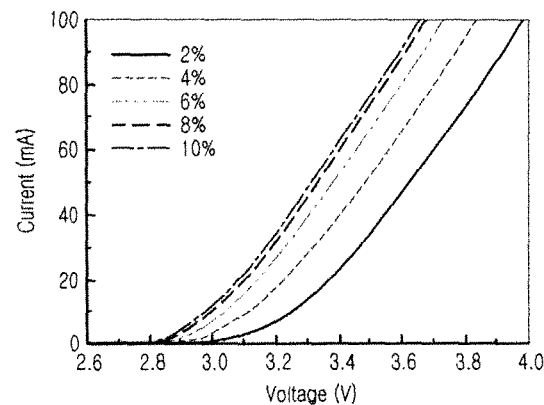
FIGS. 8A and 8B are graphs illustrating characteristics of first and second graded layers according to the content of indium (In) according to an embodiment of the present disclosure.
Figure 8B:
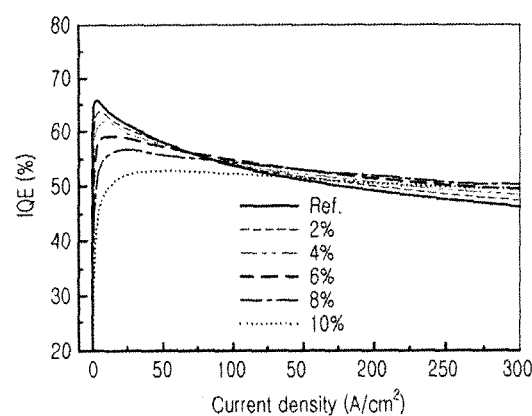

FIGS. 8A and 8B are graphs illustrating characteristics of first and second graded layers according to the content of indium (In) according to an embodiment of the present disclosure.

In detail, the first graded layer 132a is made of $In_{x1}Ga_{(1-x1)}N$ in which the value x1 may be gradually increased from 0 to z and the second graded layer 132b is made of $In_{x2}Ga_{(1-x2)}N$ in which the value x2 may be gradually decreased from z to 0. Here, 0.02, 0.04, 0.06, 0.08, and 0.10 were used as the value z and respective characteristics were compared. FIG. 8A illustrates driving voltage characteristics of the semiconductor light emitting device, and FIG. 8B illustrates a change in internal quantum efficiency IQE over an increase in current density.

Referring to FIGS. 8A and 8B, it can be seen that as the maximum content of indium (In) of the first and second graded layers 132a and 132b, namely, the value z, is increased, a driving voltage is lowered and a reduction width of IQE with respect to an increase in current density is reduced. Also, as shown in Table 1, it can be seen that an internal electrical field within the active layer 130 is reduced.

TABLE 1

|  | Value z | | | | |
| --- | --- | --- | --- | --- | --- |
|  | 0.02 | 0.04 | 0.06 | 0.08 | 0.10 |
| Internal electric field (MV/cm$^2$) | 1.267 | 1.208 | 1.151 | 1.096 | 1.044 |

However, if the content of indium (In) contained in the first and second graded layers 132a and 132b is too great, the first and second graded layers 132a and 132b may not be differentiated from the quantum well layer 131 and the characteristics of the light emitting device may be degraded due to a phenomenon wherein an electron confinement effect is lowered. Thus, the maximum content of indium (In) is required to be selected within an appropriate range. In consideration of the fact that the content of indium (In) contained in the quantum well layer 131 generally ranges from 10% to 20%, a maximum content of indium (In) contained in the first and second graded layers 132a and 132b may be selected from the range of 1% to 8%, e.g., from 5% to 8% (namely, the value z is selected from the range of 0.01 to 0.08, and in certain embodiments, from the range of 0.05 to 0.08.

Figure 9A:
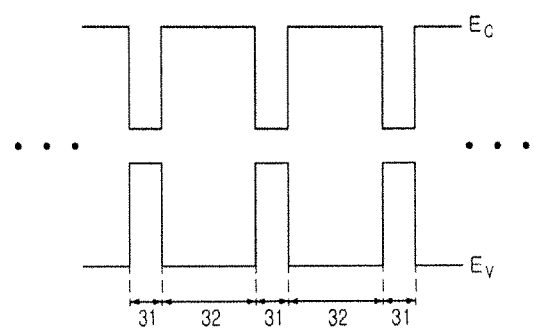
FIGS. 9A through 9C are energy band diagrams of an active layer in preparation for a semiconductor light emitting device according to an embodiment of the present disclosure and a semiconductor light emitting device according to a comparative example.
Figure 9B:
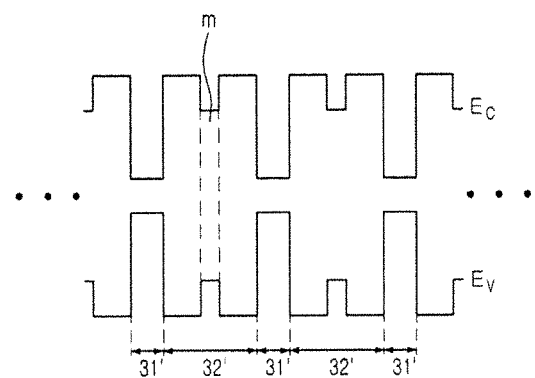
Figure 9C:
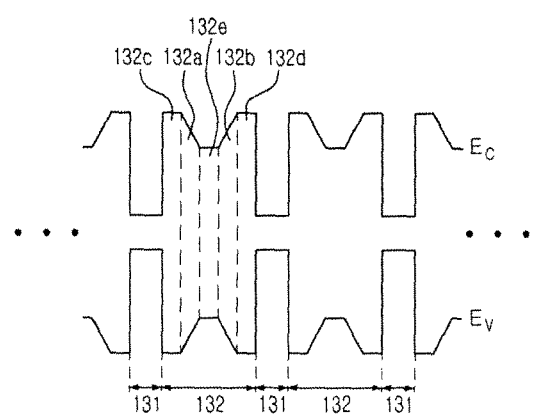
Figure 10A:
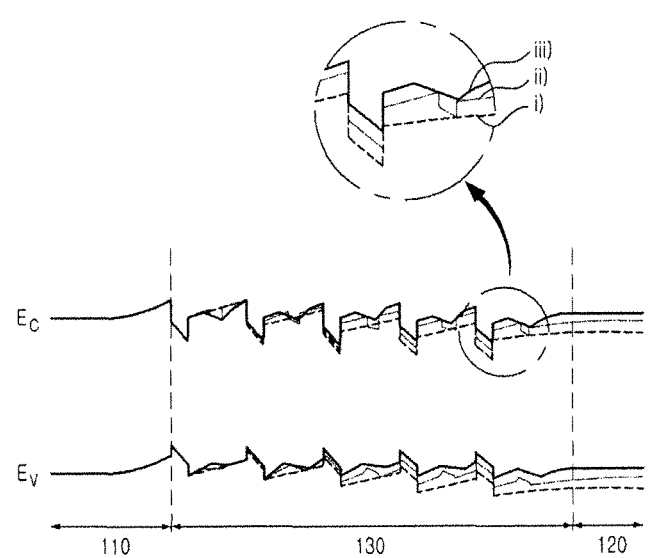
FIGS. 10A through 10C are an energy band diagram and graphs showing comparison between the characteristics of the semiconductor light emitting devices according the examples of FIGS. 9A through 9C.
Figure 10B:
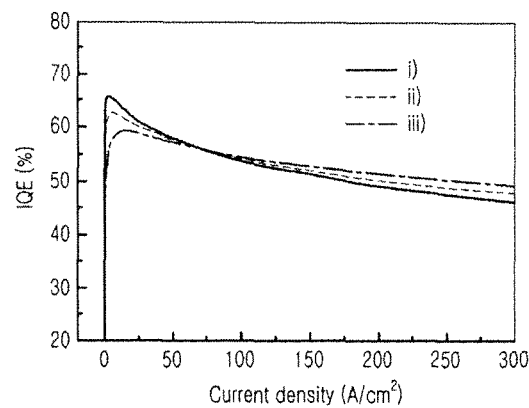
Figure 10C:
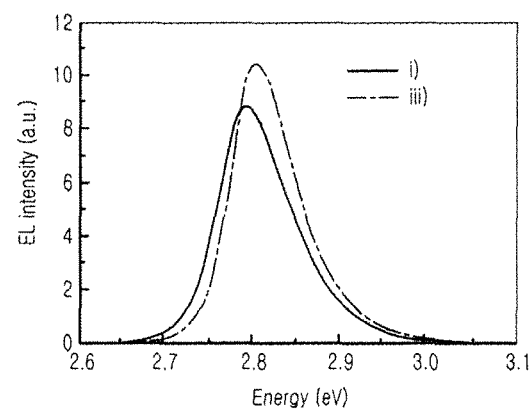

FIGS. 9A through 9C are energy band diagrams of an active layer in preparation for a semiconductor light emitting devices according to a comparative example and an embodiment of the present disclosure. FIGS. 10A through 10C are an energy band diagram and graphs showing comparison between the characteristics of the semiconductor light emitting devices according the examples of FIGS. 9A through 9C.

FIG. 9A is an energy band diagram of an active layer of a semiconductor light emitting device including an active layer in which a quantum well layer 31 made of InGaN and a quantum barrier layer 32 made of GaN are alternately laminated (comparative example 1). An energy band diagram of the active layer illustrated in FIG. 9B includes a quantum well layer 31' and a quantum barrier layer 32' and is the same as the energy band diagram of FIG. 9A, except that the latter includes an intermediate barrier layer m within the quantum barrier layer 32'. The intermediate barrier layer m may contain a predetermined amount of indium (In) (comparative example 2).

FIG. 9C is an energy band diagram of an active layer according to an embodiment of the present disclosure (embodiment 1). In this case, the active layer according to the embodiment of FIG. 5 may be employed.

The active layers according to comparative examples 1 and 2 and embodiment 1 were implemented under the conditions as shown in Table 2.

TABLE 2

|  | Comparative example (i) | Comparative example 2 (ii) | Embodiment 1 (iii) |
| --- | --- | --- | --- |
| Thickness of quantum well layer | 3 nm | 3 nm | 3 nm |
| Thickness of quantum barrier layer | 10 nm | 10 nm | 10 nm |

TABLE 2-continued

|  |  | Comparative example (i) | Comparative example 2 (ii) | Embodiment 1 (iii) |
| --- | --- | --- | --- | --- |
| Intermediate barrier layer | Thickness | — | 2 nm | — |
|  | Content of indium (In) | — | 5% | — |
| First and second graded layers | Thickness | — | — | 2 nm |
|  | Content of indium (In) | — | — | Graded within range from 0% to 5% |
| Internal barrier layer | Thickness | — | — | 2 nm |
|  | Content of indium (In) | — | — | 5% |

First, as shown in Table 3, in case of embodiment 1, it can be seen that an internal electric field due to piezoelectric polarization within the active layer was effectively reduced, in comparison to comparative example 1 and comparative example 2.

TABLE 3

|  | Comparative example (i) | Comparative example 2 (ii) | Embodiment 1 (iii) |
| --- | --- | --- | --- |
| Internal electric field (MV/cm$^2$) | 1.33 | 1.24 | 1.15 |

Accordingly, respective energy band diagrams of comparative 1, comparative 2, and embodiment 1 appear as illustrated in FIG. 10A. In detail, it can be seen that, in case of embodiment 1(iii), due to a reduction in an internal electric field, a height of a quantum barrier in a conduction band was increased and, and on the contrary, a height of a quantum barrier in a valence band was decreased, in comparison to comparative example 1(i) and comparative example 2 (ii). Thus, in the case of embodiment 1 (iii), electron blocking and hole injection efficiency were increased to increase the probability of electron-hole recombination.

Next, referring to FIG. 10B illustrating a change in internal quantum efficiency (IQE) over an increase in current density, it can be seen that, a reduction width of the IQE is reduced over an increase in current density of embodiment 1 (iii), improving efficiency droop.

Also, as illustrated in FIG. 10C, in the case of embodiment 1, it can be seen that electroluminescence (EL) intensity was effectively improved with an application current of 350 mA. In the graph, only comparative example 1 and embodiment 1 were compared for the purpose of simpler comparison.

In this manner, according to the present embodiment, the semiconductor light emitting device including the active layer with minimized polarization and having enhanced luminous efficiency can be obtained.

Hereinafter, various embodiments employable in the semiconductor light emitting device according to the present embodiment will be described.

Figure 11:
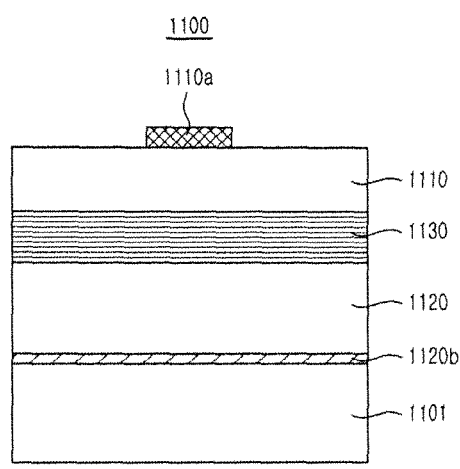
FIGS. 11 through 13 are views illustrating various configurations of a semiconductor light emitting device employable in an embodiment of the present disclosure.
Figure 12:
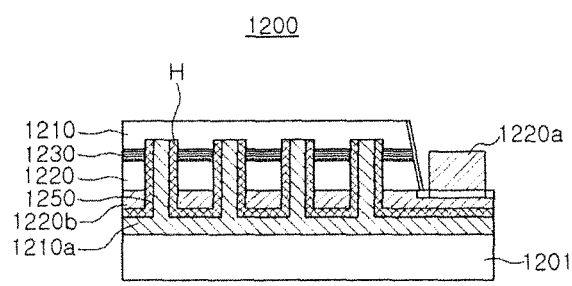
Figure 13:
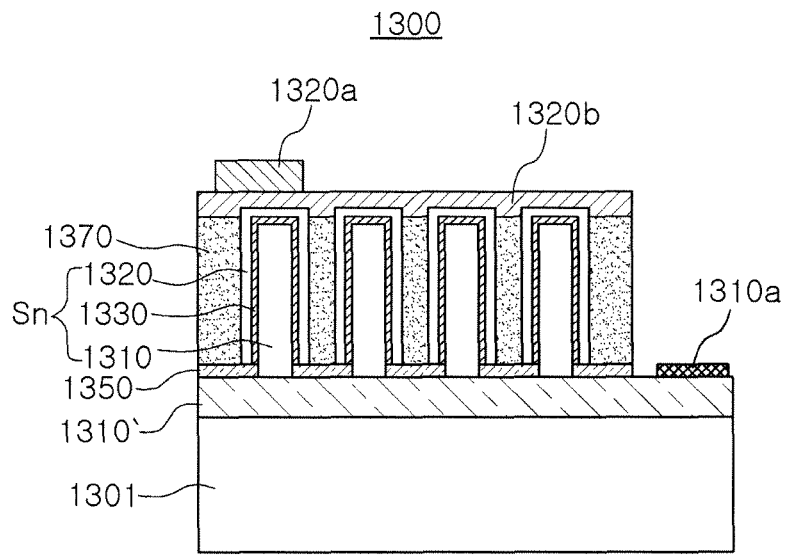

FIGS. 11 through 13 are views illustrating various configurations of a semiconductor light emitting device employable in an embodiment of the present disclosure;

Referring to FIG. 11, a semiconductor light emitting device 1100 according to the present embodiment includes a second conductivity-type semiconductor layer 1120, an active layer 1130, and a first conductivity-type semiconductor layer 1110 formed on a conductive substrate 1101. In the case of the present embodiment, the active layer 1130 may have the materials and energy bands as described above. Thus, efficiency droop can be alleviated and luminous efficiency can be improved.

The first conductivity-type semiconductor layer 1110 may be, for example, an n-type semiconductor layer, and a first electrode 1110a is formed thereon. The second conductivity-type semiconductor layer may be, for example, a p-type semiconductor. A reflective metal layer 1120b may be formed between the second conductivity-type semiconductor layer 1120 and the conductive substrate 1101. The reflective metal layer 1120b may be made of a material exhibiting electrical ohmic-characteristics with respect to the second conductivity-type semiconductor layer 1120, and may be made of a metal having a high degree of reflectivity. In consideration of this function, the reflective metal layer 1120b may be formed to include silver (Ag), nickel (Ni), aluminum (Al), rhodium (Rh), palladium (Pd), iridium (Ir), ruthenium (Ru), magnesium (Mg), zinc (Zn), platinum (Pt), gold (Au), and the like.

The conductive substrate 1101 may be connected to an external power source to apply driving power to the second conductivity-type semiconductor layer. Also, the conductive substrate 1101 may serve as a support supporting the light emitting device during a process such as a laser lift-off (LLO) for removing a growth substrate used for the growth of a semiconductor. The conductive substrate 1101 may be made of a material including any one of gold (Au), nickel (Ni), aluminum (Al), copper (Cu), tungsten (W), silicon (Si), selenium (Se), gallium arsenide (GaAs). For example, aluminum (Al) may be doped on a silicon (Si) substrate. In a certain embodiment, the conductive substrate 1101 may be formed on the reflective metal layer through a process such as sputtering, deposition, or the like. Alternatively, a previously fabricated conductive substrate 1101 may be bonded to the reflective metal layer 1120b by the medium of a conductive bonding layer, or the like.

FIG. 12 is a cross-sectional view illustrating another configuration of the semiconductor light emitting device according to the present embodiment.

Referring to FIG. 12, a semiconductor light emitting device 1200 according to the present embodiment includes a first conductivity-type semiconductor layer 1210, an active layer 1230, a second conductivity-type semiconductor layer 1220, a second electrode layer 1220b, an insulating layer 1250, a first electrode layer 1210a, and a substrate 1201, which are sequentially laminated. Here, the active layer 1230 has the materials and energy bands as described above, and thus, efficiency droop can be alleviated and luminous efficiency can be improved. Also, according to the present embodiment, current spreading efficiency can be enhanced, and an advantageous effect can be obtained in terms of heat dissipation.

In order to be electrically connected to the first conductivity-type semiconductor layer 1210, the first electrode layer 1210a includes one or more contact holes H extending from one surface of the first electrode layer 1210a to at least a partial region of the first conductivity-type semiconductor layer 1210 and electrically insulated from the second conductivity-type semiconductor layer 1220 and the active layer 1230. However, the first electrode layer 1210a is not an essential element in the present embodiment. The contact hole H may extend from an interface of the first electrode layer 1210a, passing through the second electrode layer 1220b, the second conductivity-type semiconductor layer 1220, and the active layer 1230, to the interior of the first conductivity-type semiconductor layer 1210. The contact hole H may extend at least to an interface between the active layer 1230 and the first conductivity-type semiconductor layer 1210 and, preferably, extend to a portion of the first conductivity-type semiconductor layer 1210. However, the contact hole H may be formed for electrical connectivity and current spreading of the first conductivity-type semiconductor layer 1210, so the purpose of the presence of the contact hole H is achieved when it is in contact with the first conductivity-type semiconductor layer 1210. Thus, it is not necessary for the contact hole H to extend to an external surface of the first conductivity-type semiconductor layer 1210.

The second electrode layer 1220b formed on the second conductivity-type semiconductor layer 1220 may be selectively made of a material among silver (Ag), nickel (Ni), aluminum (Al), rhodium (Rh), palladium (Pd), iridium (Ir), ruthenium (Ru), magnesium (Mg), zinc (Zn), platinum (Pt), gold (Au), and the like, in consideration of a light reflecting function and an ohmic-contact function with the second conductivity-type semiconductor layer 1220, and may be formed by using a process such as sputtering, deposition, or the like. The second electrode layer 1220b may be electrically connected to the second electrode 1220a to receive driving power.

The contact hole H may penetrate the second electrode layer 1220b, the second conductivity-type semiconductor layer 1220, and the active layer 1230 so as to be connected to the first conductivity-type semiconductor layer 1210. The contact hole H may be formed through an etching process, e.g., inductively coupled plasma-reactive ion etching (ICP-RIE), or the like.

The insulating layer 1250 is formed to cover a side wall of the contact hole H and a surface of the second conductivity-type semiconductor layer 1220. In this case, at least a portion of the first conductivity-type semiconductor layer 1210 corresponding to a lower surface of the contact hole H may be exposed. The insulating layer 1250 may be formed by depositing an insulating material such as $SiO_2$, $SiO_xN_y$, or $Si_xN_y$.

The second electrode layer 1220b including a conductive via formed by filling a conductive material is formed within the contact hole H. Subsequently, the substrate 1201 is formed on the second electrode layer 1220b. In this structure, the substrate 1201 may be electrically connected by the conductive via connected to the first conductivity-type semiconductor layer 1210.

The substrate 1201 may be made of a material including any one of Au, Ni, Al, Cu, W, Si, Se, GaAs, SiAl, Ge, SiC, AlN, $Al_2O_3$, GaN, AlGaN and may be formed through a process such as plating, sputtering, deposition, bonding, or the like. But the present disclosure is not limited thereto.

In order to reduce contact resistance, the amount, shape, and pitch of the contact hole H, a contact area of the contact hole H with the first and second conductivity-type semiconductor layers 1210 and 1220, and the like, may be appropriately regulated. The contact holes H may be arranged to have various shapes in rows and columns to improve current flow. In this case, the conductive via may be surrounded by the insulating layer 1250 so as to be electrically separated from the active layer 1230 and the second conductivity-type semiconductor layer 1220.

FIG. 13 is a cross-sectional view illustrating another configuration of the semiconductor light emitting device according to the present disclosure. The semiconductor light emitting device according to the present embodiment may be understood as a semiconductor light emitting device implemented as a so-called 'nano-LED' including nano-structures. In detail, a semiconductor light emitting device 1300 according to the present embodiment includes a plurality of nano-light emitting structures Sn formed on a substrate 1301. In the present embodiment, it is illustrated that the nano-light emitting structure Sn has a core-shell structure as a rod structure, but the present disclosure is not limited thereto, and the nano-light emitting structure may have a different structure such as a pyramid structure.

The semiconductor light emitting device 1300 includes a base layer 1310' formed on the substrate 1301. The base layer 1310' is a layer providing a growth surface for the nano-light emitting structure Sn, which may be a first conductivity-type semiconductor layer. A mask layer 1350 having an open area for the growth of the nano-light emitting structure (in particular, a core) may be formed on the base layer 1310'. The mask layer 1350 may be made of a dielectric material such as $SiO_2$ or $SiN_x$.

In the nano-light emitting structure Sn, a first conductivity-type nanocore 1310 is formed by selectively growing a first conductivity-type semiconductor by using the mask layer 1350 having an open area, and an active layer 1330 and a second conductivity-type semiconductor layer 1320 are formed as shell layers on a surface of the nanocore 1310. Accordingly, the nano-light emitting structure Sn may have a core-shell structure in which the first conductivity-type semiconductor is the nanocore and the active layer 1330 and the second conductivity-type semiconductor layer 1320 enclosing the nanocore are shell layers.

The semiconductor light emitting device 1300 includes a filler material 1370 filling spaces between the nano-light emitting structures Sn. The filler material 1370 may structurally stabilize the nano-light emitting structures Sn. The filler material 1370 may be made of a transparent material such as $SiO_2$, but the present disclosure is not limited thereto. An ohmic-contact layer 1320b may be formed on the nano-light emitting structures Sn and connected to the second conductivity-type semiconductor layer 1320. The semiconductor light emitting device 1300 includes first and second electrodes 1310a and 1320a connected to the base layer 1310' formed of the first conductivity-type semiconductor and the ohmic-contact layer 1320b, respectively.

By forming the nano-light emitting structures Sn such that they have different diameters, components, and doping densities, light having two or more different wavelengths may be emitted from a single device. By appropriately adjusting light having different wavelengths, white light may be implemented in the single device without using phosphors, and light having various desired colors or white light having different color temperatures may be implemented by combining the foregoing device with a different light emitting device or wavelength conversion materials such as phosphors.

In a certain embodiment, a non-polar active layer may be obtained by utilizing nano-structures, and by forming the active layer 1330 with the materials and energy bands as described above, efficiency droop due to polarization can be effectively reduced.

Figure 14:
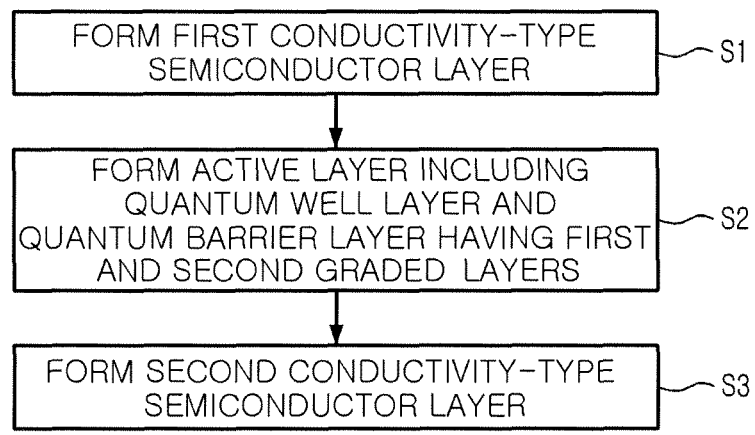
FIG. 14 is a flow chart illustrating a process of fabricating a semiconductor light emitting device according to an embodiment of the present disclosure.

FIG. 14 is a flow chart illustrating a process of fabricating a semiconductor light emitting device according to an embodiment of the present disclosure;

Referring to FIG. 14, a method for fabricating a semiconductor light emitting device according to an embodiment of the present disclosure includes forming a first conductivity-type semiconductor layer (S1), forming an active layer including a quantum well layer and a quantum barrier layer on the first conductivity-type semiconductor layer (S2), and forming a second conductivity-type semiconductor layer on the active layer (S3).

The operation (S1) of forming the first conductivity-type semiconductor layer may be an operation of forming the first conductivity-type semiconductor layer on a growth substrate.

As the growth substrate, a sapphire substrate, a silicon (Si) substrate, or the like, such as the substrate 101 as described above in the embodiment of FIG. 1, may be used. The first conductivity-type semiconductor layer may be formed by using a semiconductor growth process such as MOCVD, HVPE, or the like.

Next, the active layer including a quantum well layer and a quantum barrier layer is formed on the first conductivity-type semiconductor layer (S2). The active layer may have such a structure as described above. In detail, the active layer may have a structure in which at least one quantum barrier layer made of $In_xGa_{(1-x)}N$ ($0 \le x < y$) and at least one quantum well layer made of $In_yGa_{(1-y)}N$ ($0 < y \le 1$) are alternately disposed.

The quantum barrier layer may include first and second graded layers disposed in order that they are adjacent to the first conductivity-type semiconductor layer. The first graded layer may contain indium (In) whose content increases in a direction toward the second conductivity-type semiconductor layer, and the second graded layer may contain indium (In) whose content decreases in a direction toward the second conductivity-type semiconductor layer. The content of indium (In) may be changed by regulating an amount of indium (In) source or a growth temperature. Details thereof will be described below with reference to FIGS. 15A and 15B.

Next, the second conductivity-type semiconductor layer is formed on the active layer (S3). The second conductivity-type semiconductor layer may be formed by using a semiconductor growth process such as MOCVD, HVPE, or the like, as described above.

Figure 15A:
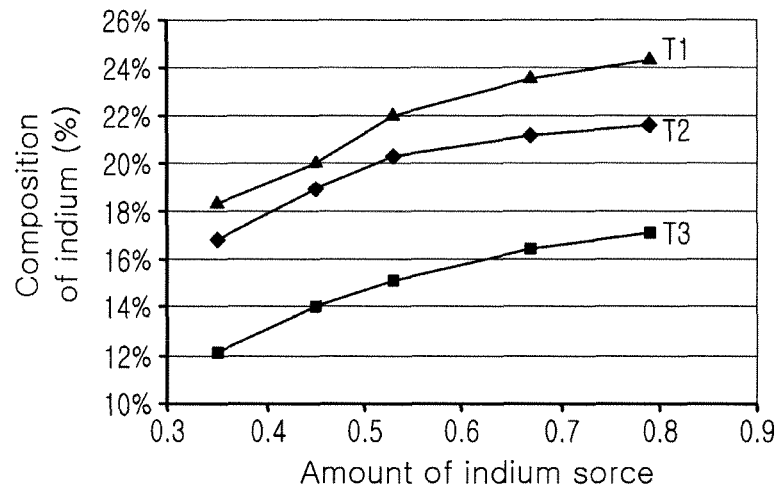
FIGS. 15A and 15B are graphs showing a composition ratio of indium (In) contained in a quantum barrier layer over an amount of indium source and a growth temperature, respectively.
Figure 15B:
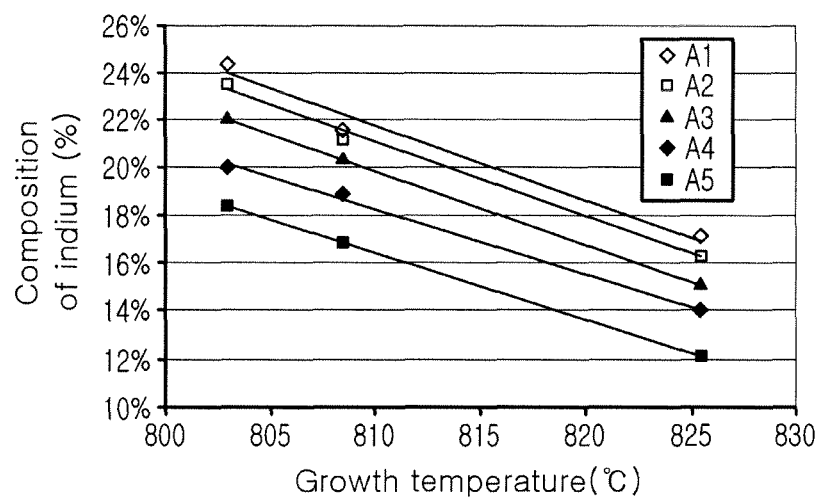

FIG. 15A illustrates a degree of change in the content of indium (In) contained in a quantum barrier layer over a change in an amount of indium (In) source. FIG. 15B illustrates a degree of change in the content of indium (In) contained in a quantum barrier layer over a change in a growth temperature. Here, T1 to T3 represent growth temperatures (° C.), and T1<T2<T3 is satisfied. Also, A1 to A5 represent an amount of indium (In) source, and A1>A2>A3>A4>A5 is satisfied. As an indium (In) source, trimethyl indium (TMIn) may be used.

Referring to FIGS. 15A and 15B, it can be seen that a composition percentage (value x) of indium (In) within the quantum barrier layer made of $In_xGa_{(1-x)}N$ increases as the amount of indium (In) source increases. Further, under a condition in which the amount of indium (In) source is equal, the composition percentage of indium (In) within the quantum barrier layer may be increased as a growth temperature is lowered, as a result of the volatility of indium (In).

Meanwhile, it can be seen that, when the amount of indium (In) source is equal to or greater than a predetermined level, the composition percentage variation of indium (In) is reduced over the increase in the amount of indium (In) source. Namely, in a region in which the amount of indium (In) source is 0.7 or greater, the content of indium (In) contained in the quantum barrier layer may be controlled by regulating only a growth temperature.

In further detail, the first graded layer is formed to have indium (In) which gradually increases, so after setting the amount of indium (In) source to 0.7 or greater, a growth temperature may be gradually varied from a high temperature to a low temperature (e.g., from T3 to T1) in forming the first graded layer, whereby the first graded layer having a desired form may be formed.

Meanwhile, the content of indium (In) contained in the quantum barrier layer may also be controlled by varying the amount of indium (In) source while maintaining a growth temperature uniformly.

Also, in the case of the present embodiment, both the amount of indium (In) source and the growth temperature may be varied. For example, the first graded layer may be formed by gradually increasing the amount of indium (In) source while gradually lowering the growth temperature, and thereafter, the second graded layer may be formed by gradually reducing the amount of indium (In) source while gradually increasing the growth temperature. In this case, the active layer having the energy bands illustrated in FIGS. 2, 5, and 7 can be easily formed by simultaneously controlling the two parameters, the amount of indium (In) source and the growth temperature.

Figure 16:
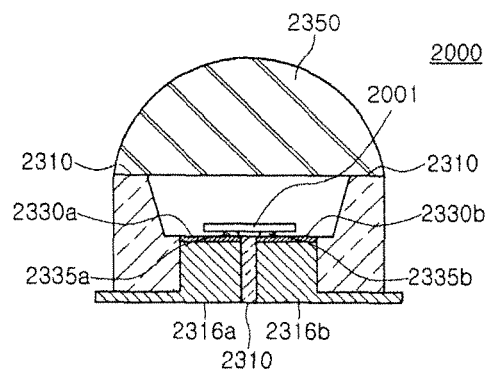
FIG. 16 is a view illustrating an example of a package employing the semiconductor light emitting device according to an embodiment of the present disclosure.

FIG. 16 is a view illustrating an example of a package employing the semiconductor light emitting device according to a certain embodiment of the present disclosure.

Referring to FIG. 16, a light emitting device package 2000 according to the present embodiment includes a light emitting device 2001 and first and second electrodes 2316a and 2316b provided below the light emitting device 2001 to allow the light emitting device 2001 to be attached thereto. As the light emitting device 2001, the semiconductor light emitting devices 1000, 1100, 1200, and 1300 according to various embodiments as previously described may be used. The light emitting device 2001 may be attached to the first and second electrodes 2316a and 2316b through flipchip bonding.

The first and second electrodes 2316a and 2316b may be separately provided to serve to apply a driving voltage to the light emitting device 2001 and dissipate heat generated by the light emitting device 2001. To this end, first and second bonding metals 2335a and 2335b are interposed between the light emitting device 2001 and the first electrode 2316a and between the light emitting device 2001 and the second electrode 2316b. Here, the bonding metals 2335a and 2335b may be solder formed of a gold (Au)-tin (Sn) alloy, a tin (Sn)-silver (Ag) alloy, or the like, or a metal such as gold (Au), copper (Cu), or the like. Meanwhile, the light emitting device 2001 may be attached to the first and second electrodes 2316a and 2316b with a conductive adhesive.

Preferably, reflective layers 2330a and 2330b are coated on the first and second electrodes 2316a and 2316b to which the light emitting device 2011 is attached in order to reflect light generated by the light emitting device 2001 upwardly from the light emitting device 2001. Here, the reflective layers 2330a and 2330b may be made of silver (Ag), aluminum (Al), or the like.

The first and second electrodes 2316a and 2316b are supported by a package housing 2310. Here, the package housing 2310 may be made of a material stable at high temperatures or a heat-resistant insulating material such as a ceramic, or the like. Meanwhile, the package housing 2310 is also provided between the first and second electrodes 2316a and 2316b to electrically insulate the first electrode 2316a and the second electrode 2316b. A lens 2350 serving to collect or distribute light generated by the light emitting device 2001 may be formed on the package housing 2310. As illustrated, the lens 22350 may be a dome-type lens, or various types of lenses, such as a flat-type lens, or the like, may also be used.

Figure 17:
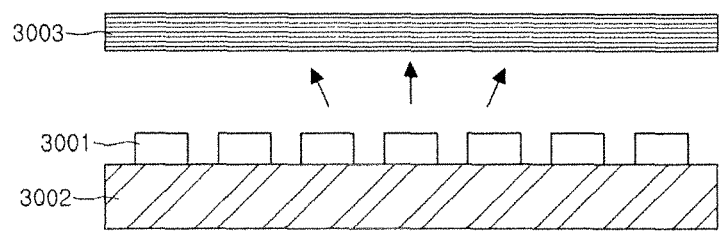
FIGS. 17 and 18 are views illustrating an example in which a semiconductor light emitting device according to an embodiment of the present disclosure is applied to a backlight unit.
Figure 18:
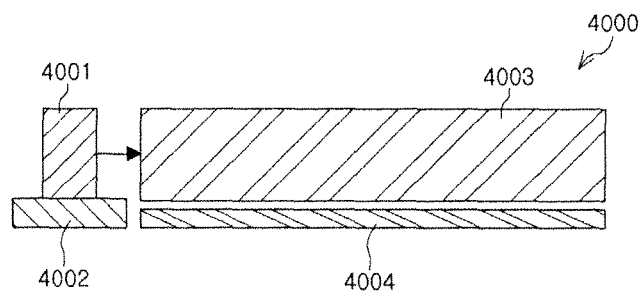

FIGS. 17 and 18 are views illustrating an example in which a semiconductor light emitting device according to an embodiment of the present disclosure is applied to a backlight unit. Referring to FIG. 17, in a backlight unit 3000, light sources 3001 are mounted on a substrate 3002, and one or more optical sheets 3003 are disposed thereabove. As the light sources 3001 may be provided as a so-called chip-on-board (COB) type by directly mounting the foregoing semiconductor light emitting devices 1000, 1100, 1200, and 1300 on the substrate 3002. Alternatively, the light emitting device package 2000 may be used.

In the backlight unit 3000 illustrated in FIG. 17, the light sources 3001 emit light toward an upper side where an LCD is disposed, but in comparison, in a backlight unit 4000 according to another example illustrated in FIG. 18, a light source 4001 mounted on a substrate 4002 emits light in a lateral direction, and the emitted light is made incident to a light guide plate 4003 so as to be changed into a surface light source. Light passing through the light guide plate 4003 is emitted upwardly, and in order to enhance light extraction efficiency, a reflective layer 4004 may be disposed under the light guide plate 4003.

Figure 19:
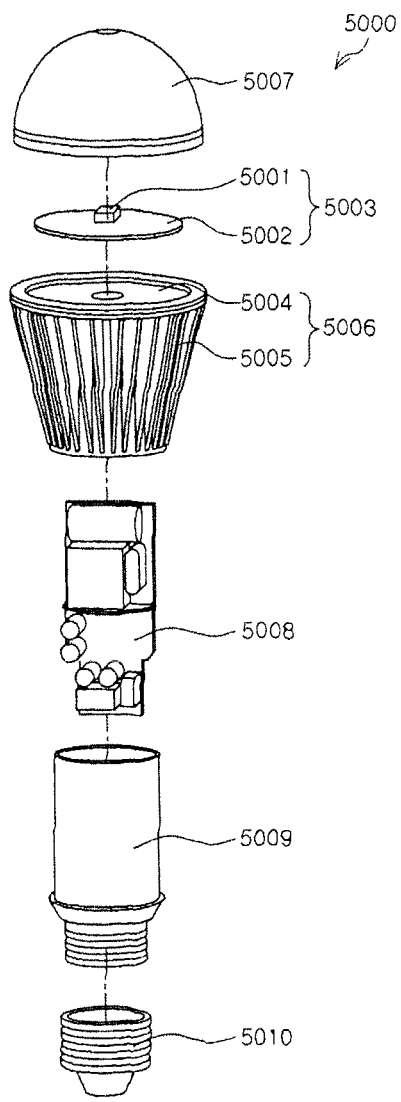
FIG. 19 is a view illustrating an example in which a semiconductor light emitting device according to an embodiment of the present disclosure is applied to a lighting device.

FIG. 19 is a view illustrating an example in which the semiconductor light emitting device 1000, 1100, 1200, or 1300 according to an embodiment of the present disclosure is applied to a lighting device.

Referring to the exploded perspective view of FIG. 19, a lighting device 5000 is illustrated as, for example, a bulb type lamp, including a light emitting module 5003, a driver 5008, and an external connector 5010. Also, the lighting device 5000 may further include external structures such as external and internal housings 5006 and 5009 and a cover 5007. The light emitting module 5003 may include a light source 5001 and a circuit board 5002 on which the light source 5001 is mounted. In the present embodiment, a single light source 5001 is illustrated as being mounted on the circuit board 5002, but the present disclosure is not limited thereto and a plurality of light sources may be mounted as necessary.

Also, in the lighting device 5000, the light emitting module 5003 may include an external housing 5006 serving as a heat dissipater, and the external housing 5006 may include a heat dissipation plate 5004 disposed to be in direct contact with the light emitting module 5003 to enhance a heat dissipation effect. Also, the lighting device 5000 may include a cover 5007 installed on the light emitting module 5003 and having a convex lens shape. The driver 5008 may be installed in the internal housing 5009 and connected to an external connector 5010 having a socket structure to receive power from an external power source. Also, the driver 5008 may serve to convert received power into an appropriate current source for driving the light source 5001 of the light emitting module 5003 and provide the same. For example, the driver 5008 may be configured as an AC-DC converter, a rectifier circuit component, or the like.

Figure 20:
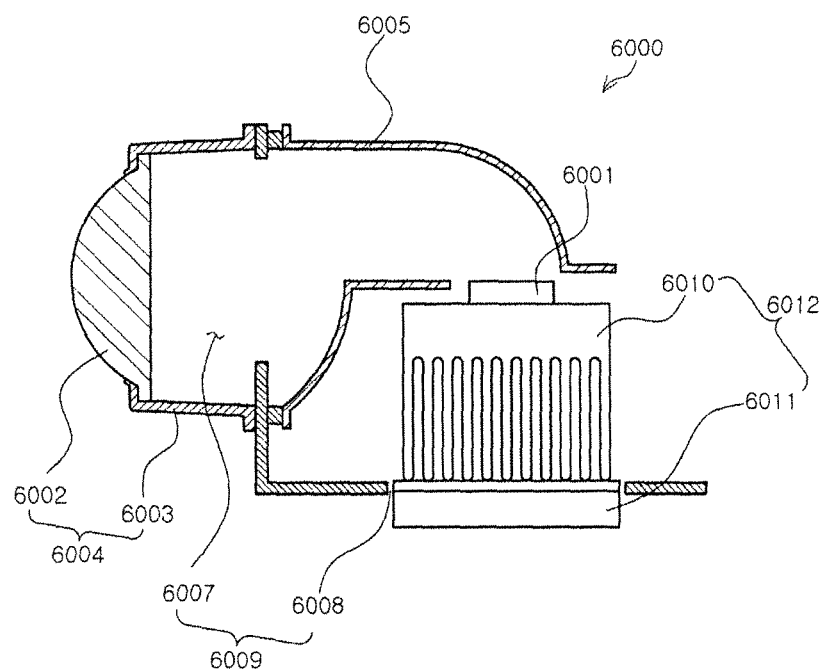
FIG. 20 is a view illustrating an example in which a semiconductor light emitting device according to an embodiment of the present disclosure is applied to a head lamp.

FIG. 20 is a view illustrating an example in which the semiconductor light emitting device 1000, 1100, 1200, or 1300 according to an embodiment of the present disclosure is applied to a head lamp.

Referring to FIG. 20, a head lamp 6000 used as a vehicle lamp, or the like, may include a light source 6001 a reflector 6005, and a lens cover 6004. The lens cover unit 6004 may include a hollow guide 6003 and a lens 6002. Also, the head lamp 6000 may further include a heat dissipater 6012 dissipating heat generated by the light source 6001 outwardly. In order to effectively dissipate heat, the heat dissipater 6012 may include a heat sink 6010 and a cooling fan 6011. Also, the head lamp 6000 may further include a housing 6009 fixedly supporting the heat dissipater 6012 and the reflector 6005, and the housing 6009 may have a central hole 6008 formed on one surface thereof, in which the heat dissipater 6012 is coupled. Also, the housing 6009 may have a front hole 6007 formed on the other surface integrally connected to the one surface and bent in a right angle direction. The front hole 6007 may allow the reflector 6005 to be fixedly positioned above the light source 6001. Accordingly, a front side is opened by the reflector 6005, and the reflector 6005 is fixed to the housing 6009 such that the opened front side corresponds to the front hole 6007, and light reflected by the reflector 6005 may pass through the front hole 6007 so as to be outwardly output.

As set forth above, according to embodiments of the present disclosure, a semiconductor light emitting device having enhanced luminous efficiency can be obtained.

Advantages and effects of the present invention are not limited to the foregoing content and any other technical effects not mentioned herein may be easily understood by a person skilled in the art from the foregoing description.

While the present invention has been shown and described in connection with the embodiments, it will be apparent to those skilled in the art that modifications and variations can be made without departing from the spirit and scope of the invention as defined by the appended claims.

What is claimed is:

1. A semiconductor light emitting device comprising:
a first conductivity-type semiconductor layer;
an active layer disposed on the first conductivity-type semiconductor layer and including at least one quantum barrier layer made of $In_xGa_{(1-x)}N(0 \leq x < y)$ and at least one quantum well layer made of $In_yGa_{(1-y)}N(0 < y \leq 1)$ alternately disposed therein; and
a second conductivity-type semiconductor layer disposed on the active layer,
wherein the quantum barrier layer comprises first and second graded layers, the first graded layer is disposed between the first conductivity-type semiconductor layer and the second graded layer, the first graded layer contains indium (In) whose content increases in a direction toward the second conductivity-type semiconductor layer, and the second graded layer contains indium (In) whose content decreases in a direction toward the second conductivity-type semiconductor layer,
wherein the quantum barrier layer comprises a first external barrier layer disposed between the first conductivity-type semiconductor layer and the first graded layer, and a second external barrier layer disposed between the second conductivity-type semiconductor layer and the second graded layer, and
wherein the first and second external barrier layers are made of GaN.

2. The semiconductor light emitting device of claim 1, wherein the first and second graded layers are disposed to be contiguous, and
an energy band of the quantum barrier layer has a symmetrical shape about an interface in which the first and second graded layers are contiguous.

3. The semiconductor light emitting device of claim 1, wherein thicknesses of the first and second graded layers range from about 3 Å to about 50 Å.

4. A semiconductor light emitting device comprising:
a first conductivity-type semiconductor layer;
an active layer disposed on the first conductivity-type semiconductor layer and including at least one quantum barrier layer made of $In_xGa_{(1-x)}N(0 \leq x < y)$ and at least one quantum well layer made of $In_yGa_{(1-y)}N(0 < y \leq 1)$ alternately disposed therein; and
a second conductivity-type semiconductor layer disposed on the active layer,
wherein the quantum barrier layer comprises first and second graded layers, the first graded layer is disposed between the first conductivity-type semiconductor layer and the second graded layer, the first graded layer contains indium (In) whose content increases in a direction toward the second conductivity-type semiconductor layer, and the second graded layer contains indium (In) whose content decreases in a direction toward the second conductivity-type semiconductor layer, wherein the quantum barrier layer comprises a first external barrier layer disposed between the first conductivity-type semiconductor layer and the first graded layer, and a second external barrier layer disposed between the second conductivity-type semiconductor layer and the second graded layer, and wherein the first and second external barrier layers are thicker than the first and second graded layers.

5. A semiconductor light emitting device comprising:

a first conductivity-type semiconductor layer;

an active layer disposed on the first conductivity-type semiconductor layer and including at least one quantum barrier layer made of $In_xGa_{(1-x)}N(0 \leq x < y)$ and at least one quantum well layer made of $In_yGa_{(1-y)}N(0 < y \leq 1)$ alternately disposed therein; and a second conductivity-type semiconductor layer disposed on the active layer, wherein the quantum barrier layer comprises first and second graded layers, the first graded layer is disposed between the first conductivity-type semiconductor layer and the second graded layer, the first graded layer contains indium (In) whose content increases in a direction toward the second conductivity-type semiconductor layer, and the second graded layer contains indium (In) whose content decreases in a direction toward the second conductivity-type semiconductor layer, and wherein the first graded layer is made of $In_{x1}Ga_{(1-x1)}N$ in which the value x1 gradually increases from 0 to z, and the second graded layer is made of $In_{x2}Ga_{(1-x2)}N$ in which the value x2 gradually decreases from z to 0, wherein $0 < z < y$ is satisfied.

6. The semiconductor light emitting device of claim 5, wherein the value z ranges from about 0.01 to about 0.08.

7. The semiconductor light emitting device of claim 5, wherein the quantum barrier layer further comprises an internal barrier layer disposed between the first and second graded layers and made of $In_zGa_{(1-z)}N$.

8. The semiconductor light emitting device of claim 7, wherein an energy band of the quantum barrier layer has a symmetrical shape about the center of the internal barrier layer.

9. A semiconductor light emitting device comprising:

a first conductivity-type semiconductor layer;

an active layer disposed on the first conductivity-type semiconductor layer and including at least one quantum barrier layer made of $In_xGa_{(1-x)}N(0 \leq x < y)$ and at least one quantum well layer made of $In_yGa_{(1-y)}N(0 < y \leq 1)$ alternately disposed therein; and a second conductivity-type semiconductor layer disposed on the active layer, wherein the quantum barrier layer comprises first and second graded layers, the first graded layer is disposed between the first conductivity-type semiconductor layer and the second graded layer, the first graded layer contains indium (In) whose content increases in a direction toward the second conductivity-type semiconductor layer, and the second graded layer contains indium (In) whose content decreases in a direction toward the second conductivity-type semiconductor layer, and wherein the first graded layer comprises a first region in which a content of indium (In) increases with a first slope and a second region in which a content of indium (In) increases with a second slope, wherein absolute values of the first and second slopes are different.

10. A semiconductor light emitting device comprising:

a first conductivity-type semiconductor layer;

an active layer disposed on the first conductivity-type semiconductor layer and including at least one quantum barrier layer made of $In_xGa_{(1-x)}N(0 \leq x < y)$ and at least one quantum well layer made of $In_yGa_{(1-y)}N(0 < y \leq 1)$ alternately disposed therein; and a second conductivity-type semiconductor layer disposed on the active layer, wherein the quantum barrier layer comprises first and second graded layers, the first graded layer is disposed between the first conductivity-type semiconductor layer and the second graded layer, the first graded layer contains indium (In) whose content increases in a direction toward the second conductivity-type semiconductor layer, and the second graded layer contains indium (In) whose content decreases in a direction toward the second conductivity-type semiconductor layer, and wherein the second graded layer comprises a third region in which a content of indium (In) decreases with a third slope and a fourth region in which a content of indium (In) decreases with a fourth slope, wherein absolute values of the third and fourth slopes are different.

11. A semiconductor light emitting device comprising:

a first conductivity-type semiconductor layer and a second conductivity-type semiconductor layer; and an active layer disposed between the first and second conductivity-type semiconductor layers and including at least one quantum barrier layer and at least one quantum well layer made of $In_yGa_{(1-y)}N$, wherein $0 < y < 1$, alternatively disposed therein, wherein the quantum barrier layer comprises an internal barrier layer made of $In_zGa_{(1-z)}N$, wherein $0 < z < y$, external barrier layers formed in both sides of the internal barrier layer and made of GaN, and graded layers disposed between the internal barrier layer and each of external barrier layers and made of $In_xGa_{(1-x)}N$, wherein $0 \leq x \leq z$, in which the content of indium (In) is increases toward the internal barrier layer.

12. The semiconductor light emitting device of claim 11, wherein the value x of the graded layers made of $In_xGa_{(1-x)}N$, wherein $0 \leq x \leq z$, gradually increases from 0 to z in the graded layers closer to the internal barrier layer, wherein the value z is determined within a range from about 0.01 to about 0.08.

13. The semiconductor light emitting device of claim 11, wherein the graded layers disposed between the internal barrier layer and each of the external barrier layers have a thickness ranging from about 3 Å to about 50 Å, respectively.

14. A semiconductor light emitting device comprising:

a first conductivity-type semiconductor layer and a second conductivity-type semiconductor layer; and an active layer disposed between the first and second conductivity-type semiconductor layers and including at least one quantum barrier layer and at least one quantum well layer made of $In_yGa_{(1-y)}N$, wherein $0 < y < 1$, alternatively disposed therein, wherein the quantum barrier layer comprises:

an internal barrier layer with two opposing major sides made of $In_zGa_{(1-z)}N$, wherein $0 < z < y$;

a first external barrier layer made of GaN arranged on one major side of the internal barrier layer;

a second external barrier layer made of GaN arranged on a second opposing major side of the internal barrier;

a first graded layer disposed between the internal barrier layer and the first external barrier layer; and a second graded layer disposed between the internal barrier layer and the second external barrier layer, wherein the first and second graded layers are made of $In_xGa_{(1-x)}N$, wherein $0 \leq x \leq z$, in which the content of In increases toward the internal barrier layer, the first graded layer comprises a first region in which a content of In increases with a first slope and a second region in which a content of In increases with a second slope, wherein absolute values of the first and second slopes are different, and the second graded layer comprises a third region in which a content of In decreases with a third slope and a fourth region in which a content of In decreases with a fourth slope, wherein absolute values of the third and fourth slopes are different.

15. The semiconductor light emitting device of claim 14, wherein the first region is located closer to the first external barrier layer than the second region, the fourth region is located closer to the second external barrier layer than the third region, the first slope is steeper than the second slope, and the fourth slope is steeper than the third slope.

16. The semiconductor light emitting device of claim 14, wherein the first region is located closer to the first external barrier layer than the second region, the fourth region is located closer to the second external barrier layer than the third region, the first slope is shallower than the second slope, and the fourth slope is shallower than the third slope.

17. The semiconductor light emitting device of claim 14, wherein the first and fourth slopes have substantially same absolute values, and the second and third slopes have substantially same absolute values.

18. The semiconductor light emitting device of claim 14, wherein the first and second graded layers disposed between the internal barrier layer and each of the external barrier layers have a thickness ranging from about 3 Å to about 50 Å, respectively.

* * * * *